(12) United States Patent
Jeong et al.

(10) Patent No.: US 7,445,856 B2
(45) Date of Patent: Nov. 4, 2008

(54) ORGANIC ELECTROLUMINESCENT DEVICE

(75) Inventors: Hye-In Jeong, Suwon-si (KR); Ok-Keun Song, Suwon-si (KR); Young-Mo Koo, Suwon-si (KR); Yong-Han Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 271 days.

(21) Appl. No.: 11/188,658

(22) Filed: Jul. 26, 2005

(65) Prior Publication Data

US 2006/0024525 A1     Feb. 2, 2006

(30) Foreign Application Priority Data

Jul. 29, 2004     (KR)     ............... 10-2004-0059737

(51) Int. Cl.
*H01L 51/54*     (2006.01)

(52) U.S. Cl. ............ 428/690; 428/917; 313/504; 313/506; 257/40; 257/E51.049; 585/26

(58) Field of Classification Search ............ 428/690, 428/917; 427/58, 66; 313/502–509; 257/40, 257/88–103, E51.001–E51.052; 252/301.16–301.35; 585/26, 427

See application file for complete search history.

(56) References Cited

U.S. PATENT DOCUMENTS

| | | | | |
|---|---|---|---|---|
| 5,077,142 A | * | 12/1991 | Sakon et al. | 428/690 |
| 5,747,183 A | * | 5/1998 | Shi et al. | 428/690 |
| 6,020,078 A | * | 2/2000 | Chen et al. | 428/690 |
| 6,720,090 B2 | * | 4/2004 | Young et al. | 428/690 |
| 2005/0146268 A1 | * | 7/2005 | Seo et al. | 313/506 |

FOREIGN PATENT DOCUMENTS

| | | | |
|---|---|---|---|
| JP | 2001332384 | * | 11/2001 |
| JP | 2003142267 | * | 5/2003 |
| KR | 2002-0026864 | | 4/2002 |

OTHER PUBLICATIONS

Machine Translation of JP 2001332384.*

* cited by examiner

*Primary Examiner*—Callie Shosho
*Assistant Examiner*—Michael E Nelson
(74) *Attorney, Agent, or Firm*—H.C. Park & Associates, PLC

(57) ABSTRACT

An organic electroluminescent device including an organic green emission layer comprising a green emission material and a blue emission material. The green emission layer is interposed between a pair of electrodes.

14 Claims, 2 Drawing Sheets

ORGANIC ELECTROLUMINESCENT DEVICE

CROSS REFERENCE TO RELATED APPLICATION

This application claims priority to and the benefit of Korean Patent Application No. 10-2004-0059737, filed on Jul. 29, 2004, in the Korean Intellectual Property Office, the disclosure of which is incorporated herein in its entirety by reference.

BACKGROUND OF THE INVENTION

1. Field of the Invention

The present invention relates to an organic electroluminescent device that has a long lifetime.

2. Description of the Related Art

Organic electroluminescent devices are self-emissive devices that emit light when a current is applied to a fluorescent or phosphorescent organic layer through the combination of electrons and holes in the organic layer. Organic electroluminescent devices have many advantages including being light weight, easy to manufacture, having high resolution, and having wide viewing angles. In addition, organic electroluminescent devices can display moving pictures with high color purity, and have low power consumption and a low driving voltage. These advantages make organic electroluminescent devices suitable for use in portable electronics.

Generally, in order to improve efficiency and decrease the driving voltage, an organic electroluminescent device comprises an emission layer, an electron transport layer, and a hole transport layer, all of which are organic layers. Many factors affect lifetime, efficiency, a driving voltage, color coordinates, of the organic electroluminescent device. Such factors include the thickness of the individual organic layers, the concentration of a dopant in the emission layer, and the total thickness of all of the organic layers.

In order to emit green light, the emission layer may comprise Alq3. However, when the emission layer is composed of only Alq3, excess holes are generated such that the emission layer deteriorates, thus decreasing the lifetime of the device. The holes combine with a pair of unshared electrons of oxygen of Alq3, thus altering the stable structure of Alq3. The changed stable structure of Alq3 results in a deterioration of the emission layer.

SUMMARY OF THE INVENTION

The present invention provides an organic electroluminescent device that has a long lifetime.

An organic electroluminescent device according to the present invention includes a green emission layer comprised of a blue emission material and a green emission material. The blue emission material exhibits better stability with respect to holes and provides a longer device lifespan than the green emission material. The organic electroluminescent device with this type of green emission layer has excellent luminous efficiency, a long lifespan, a low driving voltage, and efficient color coordinate characteristics.

Additional features of the invention will be set forth in the description which follows, and in part will be apparent from the description, or may be learned by practice of the invention.

The present invention discloses an organic electroluminescent device comprising an organic layer that is formed between a pair of electrodes. The organic layer is a green emission layer composed of a green emission material and a blue emission material.

The present invention also discloses an organic electroluminescent device comprising a first electrode, a hole transport layer formed on the first electrode, a green emission layer comprising a green emission material and a blue emission material formed on the hole transport layer, an electron transport layer formed on the green emission layer, and a second electrode formed on the electron transport layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

A green emission layer of an organic electroluminescent device according to an embodiment of the present invention comprises a blue emission material and a green emission material. The blue emission material exhibits greater stability with respect to holes and better hole transport characteristics than the green emission material. Thus, the emission layer comprising the green emission material and the blue emission material exhibits greater stability with respect to holes and has a longer lifespan than an emission layer comprising only of the green emission material.

The emission layer according to the present embodiment comprises 80 to 120 parts by weight of the blue emission material based on 100 parts by weight of the green emission material. When the amount of the blue emission material is less than 80 parts by weight, the increase in lifespan of the device is negligible. When the amount of the blue emission material is greater than 120 parts by weight, the efficiency of the device decreases.

The green emission material may have a maximum absorption wavelength ($\lambda$max) of 500 to 550 nm and a glass transition temperature (Tg) greater than 150° C., preferably in the range of 150 to 200° C. It may also have a highest occupied molecular orbital (HOMO) is energy level in the range of 5.7 to 5.9 eV and a lowest unoccupied molecular orbital (LUMO) energy level in the range of 3.0 to 3.2 eV. Such a green emission material may include but is not limited to Alq3, Tb(acac)$_3$ (where acac is acetylacetonate), Coumarin6, NSD, Coronene, OXD-2, and OXD-3, all of which are represented by the molecular structures below.

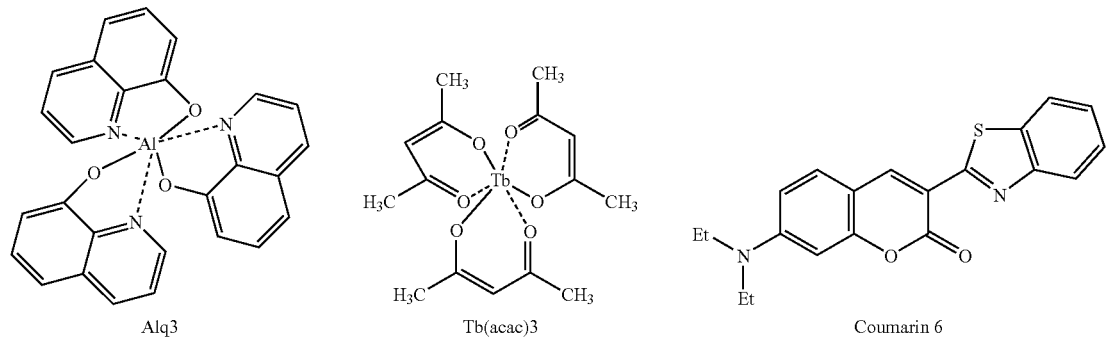
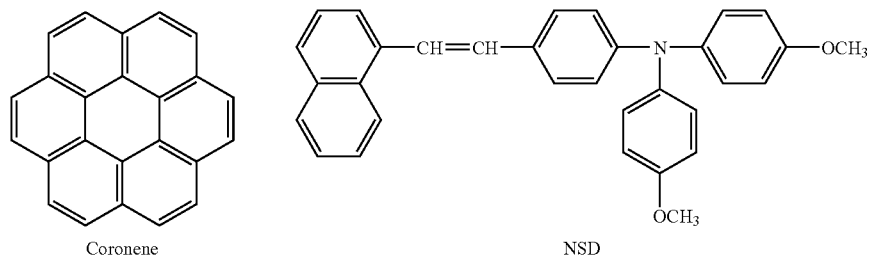
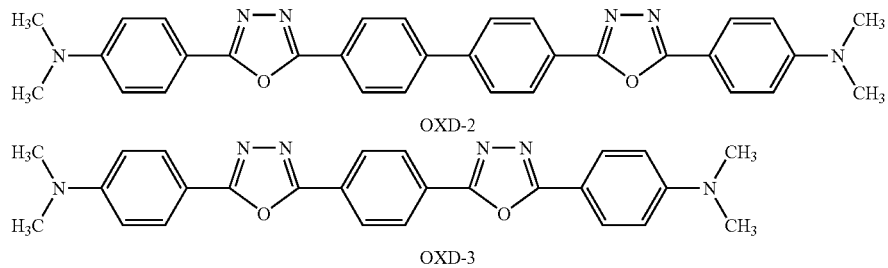
The blue emission material may be but is not limited to Spiro-DPVBi, compound A, Flrpic, CzTT, Anthracene, TPB, PPCP, DST, TPA, OXD-4, BBOT, AZM-Zn, and compound B all of which are represented by the molecular structures below, a compound represented by formula 1, or the like.
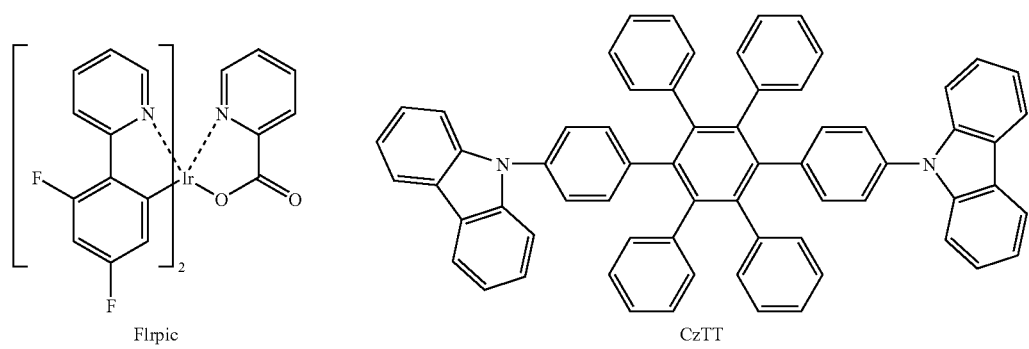

-continued
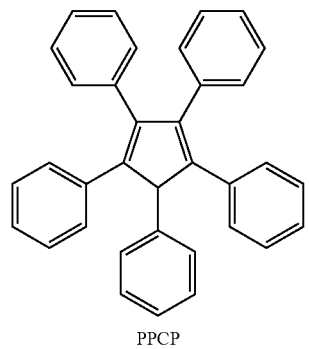
PPCP
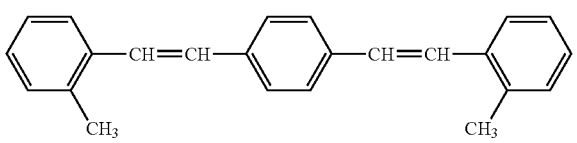
DST
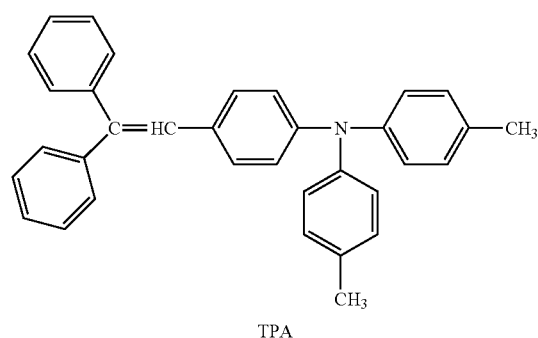
TPA
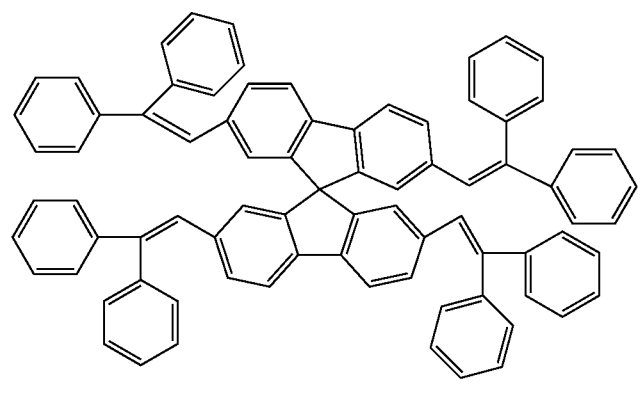
Spiro-DPVBi
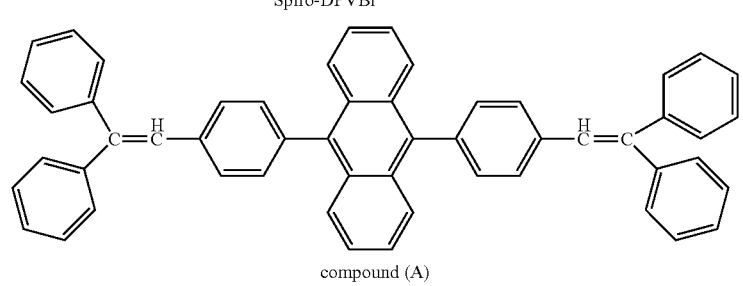
compound (A)
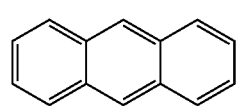
anthracene
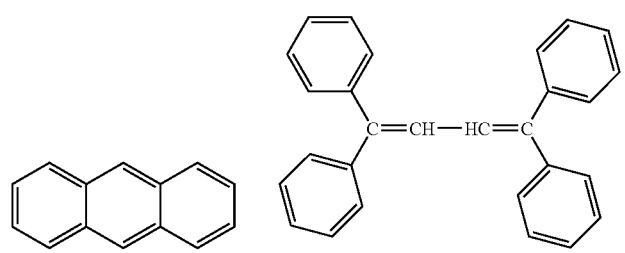
TPB

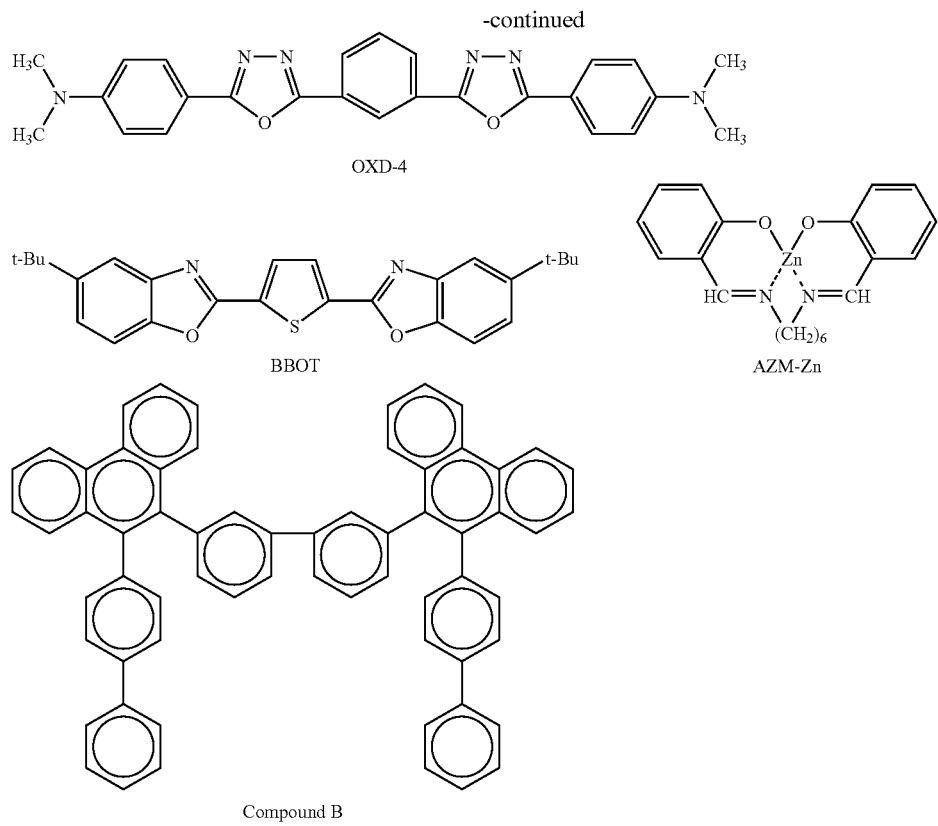

In addition, the compounds disclosed in Japanese Patent Laid-Open Publication 2000-192028, 2000-191560, 2000-48955, and 2000-7604, and Japanese Patent No. Hei. 10-11063, all of which are incorporated into the present invention by reference, can also be used as the blue emission material of the emission layer.

In addition, the blue emission material may be an anthracene derivative that can emit blue light with high luminance, high luminous efficiency, and high color purity.

The emission layer may be about 300 to 500 Å thick. An electron transport layer may be about 150 to 600 Å thick. When the thickness of electron transport layer is greater than 600 Å, the driving voltage of the organic electroluminescent device increases.

Figure 1:
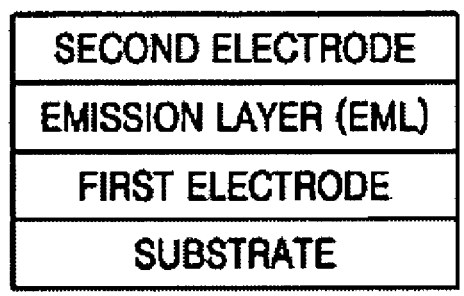
FIG. 1 illustrates the structure of an organic electroluminescent device according to an exemplary embodiment of the present invention.

FIG. 1 illustrates the structure of an organic electroluminescent device according to an exemplary embodiment of the present invention.

Referring to FIG. 1, the organic electroluminescent device comprises a first electrode, an emission layer (EML), and a second electrode that are stacked on a substrate.

Figure 2:
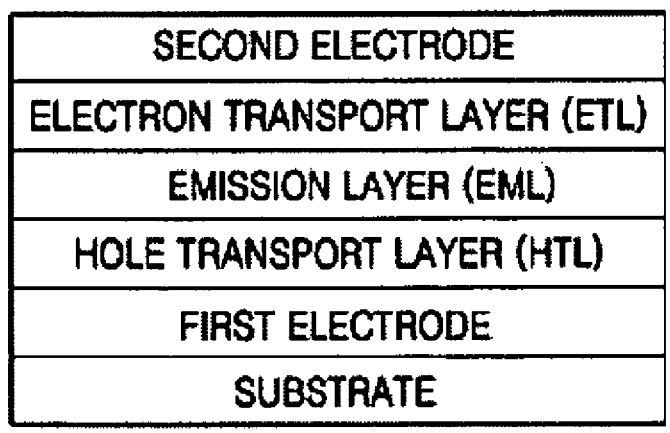
FIG. 2 illustrates the structure of an organic electroluminescent device according to another exemplary embodiment of the present invention.

FIG. 2 illustrates the structure of an organic electroluminescent device according to another exemplary embodiment of the present invention.

The organic electroluminescent device of FIG. 2 additionally comprises a hole transport layer (HTL) that is formed between the first electrode and the EML and an electron transport layer (ETL) that is formed between the EML and the second electrode.

Figure 3:
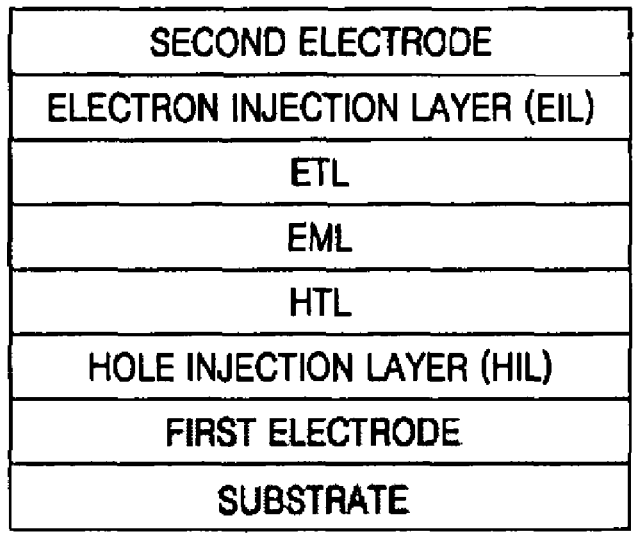
FIG. 3 illustrates the structure of an organic electroluminescent device according to another exemplary embodiment of the present invention.

FIG. 3 illustrates the structure of an organic electroluminescent device according to another exemplary embodiment of the present invention.

The organic electroluminescent device of FIG. 3 additionally comprises a hole injection layer (HIL) that is formed between the first electrode and the HTL and an electron injection layer (EIL) that is formed between the ETL and the second electrode.

Figure 4:
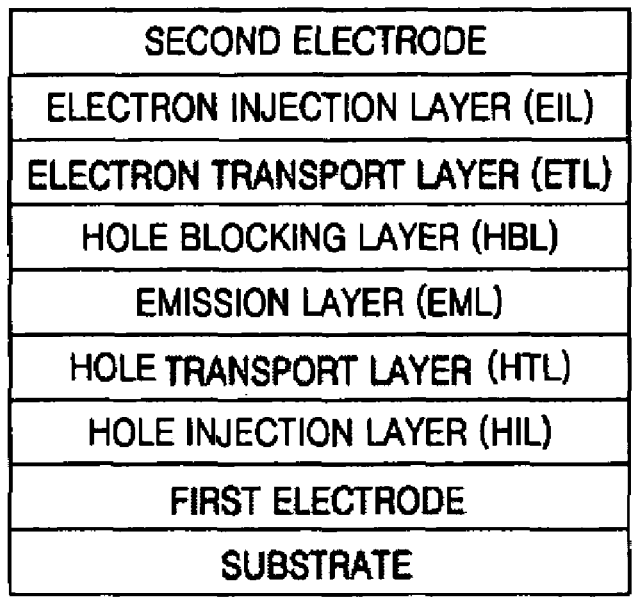
FIG. 4 illustrates the structure of an organic electroluminescent device according to another exemplary embodiment of the present invention.

FIG. 4 illustrates the structure of an organic electroluminescent device according to another exemplary embodiment of the present invention.

The organic electroluminescent device of FIG. 4 additionally comprises a hole blocking layer (HBL) that is formed between the EML and the ETL.

A method of manufacturing an organic electroluminescent device according to the embodiments of the present invention will now be described with reference to FIG. 1, FIG. 2, FIG. 3, and FIG. 4.

The substrate may be one that is used in a conventional organic electroluminescent device, preferably glass or a plastic that is transparent and waterproof, has a smooth surface, and can be easily treated. An upper surface of the substrate is coated with an anode material to form an anode which is the first electrode. The anode material may be transparent and highly conductive. Examples of the anode material may include, but are not limited to, Indium Tin Oxide (ITO), Indium Zinc Oxide (IZO), $SnO_2$, and ZnO.

After the anode is formed, a hole injection layer is optionally formed on the anode. The HIL is formed by vacuum-thermal depositing a hole injection layer material on the anode, or by spin-coating the anode with the hole injection layer material. The hole injection layer may be about 300 Å to 1500 Å thick. When the thickness of the hole injection layer is less than 300 Å, the lifespan and reliability of the organic electroluminescent device decrease. Particularly for a passive matrix organic electroluminescent device, when the hole injection layer is too thin, an undesirable pixel short may occur. When the hole injection layer is more than 1500 Å thick, the driving voltage increases, which is also undesirable.

The hole injection layer material may comprise copper phthalocyanine (CuPc) and starburst-type amines such as TCTA, m-MTDATA, and IDE406 (Idemitz), for example.

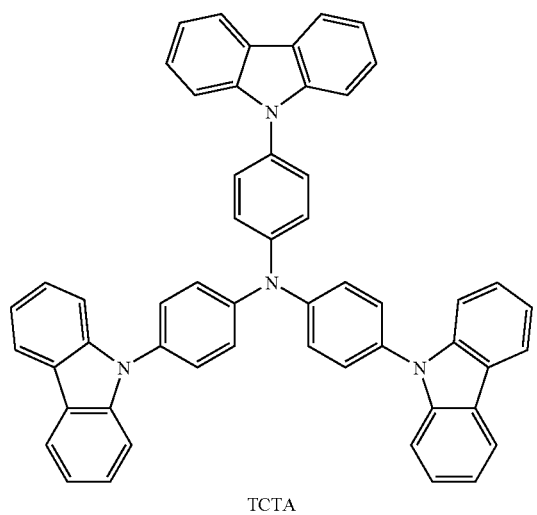

TCTA

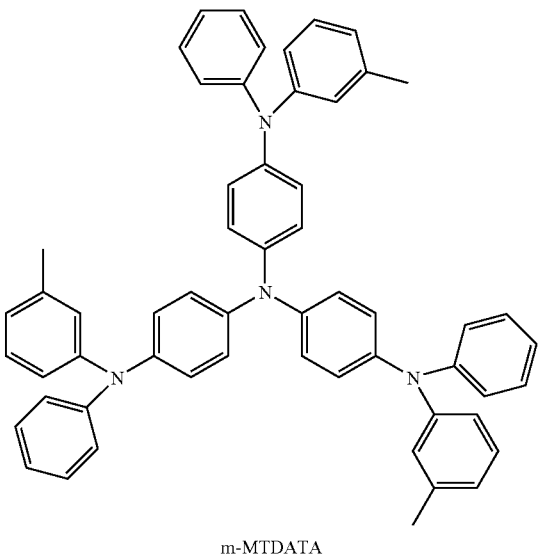

m-MTDATA

After the hole injection layer is formed, an HTL is optionally formed by vacuum-thermal depositing a hole transporting material on the hole injection layer, or by spin-coating the hole injection layer with the hole transporting material. The hole transporting material may include, but is not limited to N N,N'-bis(3-methylphenyl)-N,N'-diphenyl-[1,1-biphenyl]-4, 4'-diamine(TPD), N,N'-di(naphthalene-1-yl)-N,N'-diphenyl-benzidine (α-NPD), and IDE320 (Idemitz). The hole transport layer may be in the range of 100 to 400 Å thick. When the thickness of the hole transport layer is less than 100 Å, the hole transporting ability decreases due to the low thickness, which is undesirable. When the thickness of the hole transport layer is greater than 400 Å, the driving voltage of the device increases, which is also undesirable.

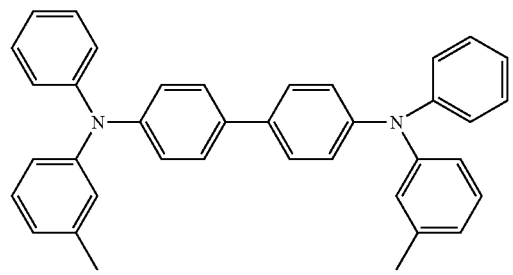

TPD

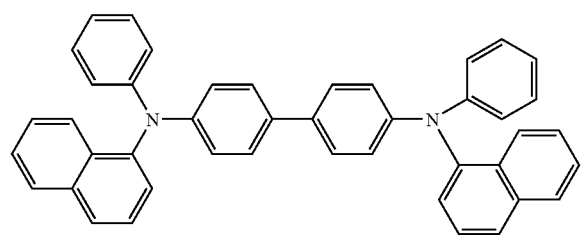

alpha-NPD

After the hole transport layer is formed, an EML is formed using the green emission material and the blue emission material. When needed, a conventional dopant is added to the green emission material and the blue emission material. The dopant can be one that is commonly used to form a green emission layer such as C314S, C343S, C7, C7S, C6, C6S, C314T, and C545T for example, as shown below. The concentration of the dopant may be in the range of 0.2 to 3 wt % based on the total weight of the green emission material and the blue emission material. When the concentration of the dopant is less than 0.2 wt %, the efficiency of the device decreases. When the concentration of the dopant is greater than 3 wt %, the lifespan of the device is reduced.

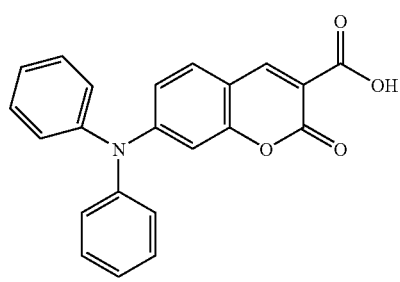

C343S

-continued

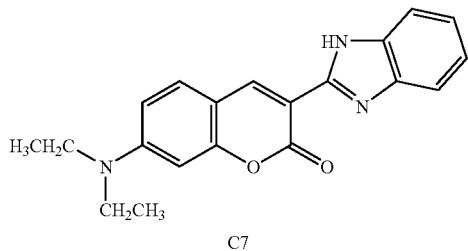
C7

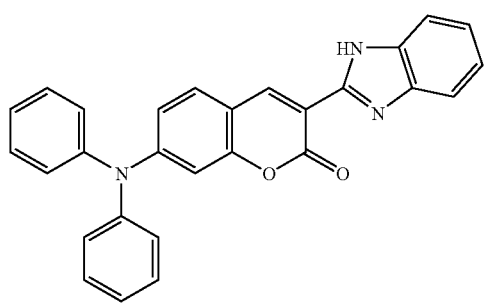
C7S

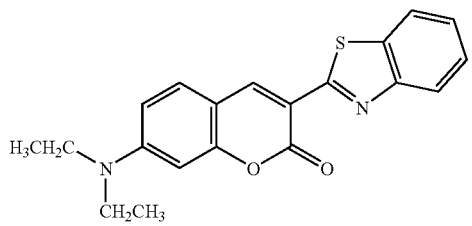
C6

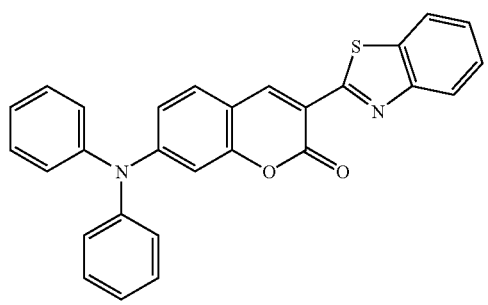
C6S

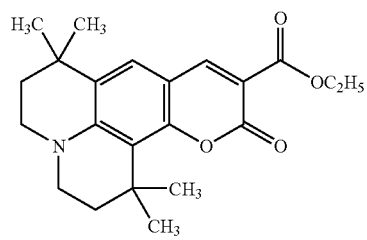
C314T

-continued

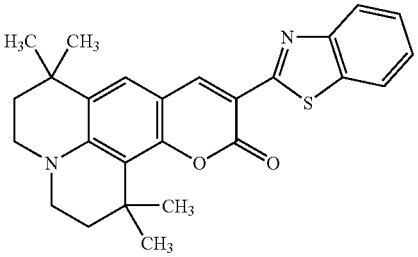
C545T

After the emission layer is formed, an HBL is optionally formed on the emission layer.

The hole blocking layer may be formed by depositing a hole blocking material on the emission layer, or by spin-coating the emission layer with the hole blocking material. The hole blocking material may have an electron transporting ability and an ionization potential that is greater than that of the emission material. The hole blocking material may include, but is not limited to bis(2-methyl-8-quinolato)-(p-phenylphenolato)-aluminum (Balq), bathocuproine(BCP), and tris(N-arylbenzimidazole)(TPBI). The hole blocking layer may be about 30 Å to 70 Å thick. When the hole blocking layer is less than 30 Å thick, the hole blocking ability is weak. When the hole blocking layer is greater than 70 Å thick, the driving voltage increases.

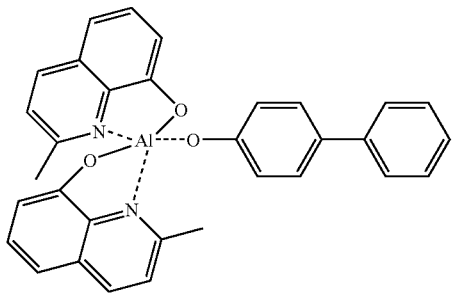
Balq

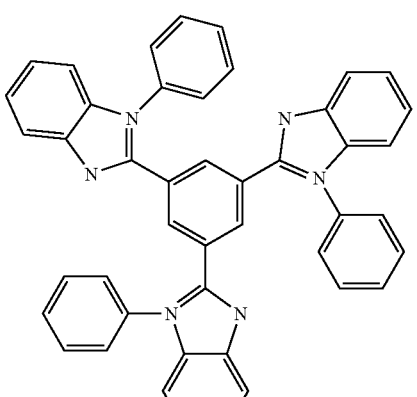
TCM

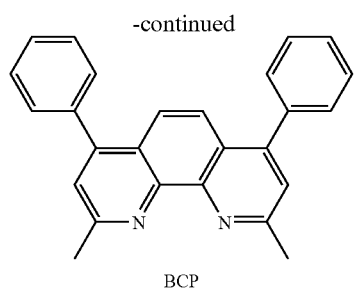

BCP

An ETL may be formed by vacuum-depositing an electron transporting material on the hole blocking layer, or by spin-coating the hole blocking layer with the electron transporting material. The electron transporting material may be Alq3, but is not limited thereto. The electron transport layer may be about 150 Å to 600 Å thick. When the electron transport layer is less than 150 Å thick, the electron transporting ability decreases. When the electron transport layer is greater than 600 Å thick, the driving voltage increases.

In addition, an EIL may optionally be formed on the electron transport layer. The electron injection layer may comprise LiF, NaCl, CsF, $Li_2O$, BaO, or Liq, for example. The electron injection layer may be about 5 Å to 20 Å thick. When the electron injection layer is less than 5 Å thick, the electron injecting ability decreases. When the electron injection layer is greater than 20 Å thick, the driving voltage increases.

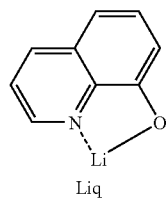

Liq

Subsequently, a cathode metal is vacuum-thermal deposited on the electron injection layer to form a cathode, which is the second electrode. The cathode metal may include, but is not limited to Li, Mg, Al, Al—Li, Ca, Mg—In, Mg—Ag, and the like.

In addition, the organic electroluminescent device may further include an electron blocking layer that is formed between the EML and the HTL.

The present invention will now be described in further detail with reference to the following examples. The following examples are for illustrative purposes and are not intended to limit the scope of the present invention.

EXAMPLE 1

A glass substrate with an ITO anode (Corning) with a surface resistance of 15 $\Omega/cm^2$ and a thickness of 1200 Å was cut to be 50 mm×50 mm×0.7 mm. The resulting glass substrate was cleaned in an ultrasonic cleaner with isopropyl alcohol for 5 minutes, cleaned in an ultrasonic cleaner using pure water for 5 minutes, and cleaned using UV light and ozone for 30 minutes.

IDE406 (Idemitz) was vacuum-deposited on the glass substrate to form a 600 Å thick hole injection layer. IDE320 (Idemitz) was vacuum-deposited on the hole injection layer to form a 300 Å hole transport layer.

50 parts by weight of Alq3 as a green emission material and 50 parts by weight of a compound represented by Compound B as a blue emission material were co-deposited on the hole transport layer to form an emission layer with a thickness of about 400 Å. Subsequently, Alq3 as an electron transporting material was deposited on the emission layer to form an electron transport layer with a thickness of 250 Å.

LiF was vacuum-deposited on the electron transport layer to form a 10 Å thick electron injection layer and Al was vacuum-deposited on the electron injection layer to form a 1000 Å thick LiF/Al cathode. Thus, an organic electroluminescent device was fabricated.

EXAMPLE 2

An organic electroluminescent device was fabricated in the same manner as in Example 1, except that an emission layer was formed by co-depositing 50 parts by weight of Alq3 as a green emission material, 50 parts by weight of a compound represented by Compound B of a blue emission material, and 2 parts by weight of Coumarin 6 as a dopant on the hole transport layer to a thickness of about 400 Å. An electron transport layer was formed by depositing Alq3 as an electron transporting material on the emission layer to a thickness of 250 Å.

EXAMPLE 3

An organic electroluminescent device was fabricated in the same manner as in Example 1, except that an emission layer was formed by co-depositing 50 parts by weight of Alq3 as a green emission material, 50 parts by weight of Flrpic as a blue emission material, and 2 parts by weight of Coumarin 6 as a dopant on the hole transport layer to a thickness of about 400 Å. An electron transport layer was formed by depositing Alq3 as an electron transporting material on the emission layer to a thickness of 250 Å.

EXAMPLE 4

An organic electroluminescent device was fabricated in the same manner as in Example 1, except that an emission layer was formed by co-depositing 50 parts by weight of Alq3 as a green emission material, 50 parts by weight of a compound represented by Compound B as a blue emission material, and 2 parts by weight of C545T as a dopant on the hole transport layer to a thickness of about 400 Å. An electron transport layer was formed by depositing Alq3 as an electron transporting material on the emission layer to a thickness of 250Å.

COMPARATIVE EXAMPLE 1

An organic electroluminescent device was fabricated in the same manner as in Example 1, except that an emission layer was formed by depositing 100 parts by weight of Alq3 (green emission material) host and 2 parts by weight of Coumarin 6 as a dopant on the hole transport layer to a thickness of 400 Å. An electron transport layer was formed by depositing Alq3 as an electron transporting material on the emission layer to a thickness of 250 Å.

Initial characteristics and the half-life of the organic electroluminescent devices according to Example 1, Example 2, Example 3, and Example 4 and Comparative Example 1 were measured. The results from Example 4 and Comparative Example 1 are shown in Table 1.

1) Initial Characteristics

Luminance was measured using BM5A (Topcon America Corp.), and a driving voltage was measured using KEITHLEY 236 (Keithley Instruments Inc.). The current density that was applied to the organic electroluminescent devices was in the range of 10 to 100 $mA/cm^2$, and increased by 10 $mA/cm^2$. At least 9 points in each of the organic electroluminescent devices were tested. The test was performed more than twice and the initial characteristics exhibited excellent reproducibility with a deviation of 5%.

2) Half-Life

Half-life was measured using two methods. In the first method, a current density was fixed at DC 50 mA/cm$^2$. In the other method, pulse currents with current densities of 600 mA/cm$^2$ were applied. Then a change of lifespan was observed until the lifetime was reduced to half-lifetime.

TABLE 1

| | Initial Characteristics (DC @100 mA/cm$^2$) | Half-lifetime (DC @50 mA/cm$^2$) | Half-lifetime (Pulse @600 mA/cm$^2$) |
|---|---|---|---|
| Example 4 | 9.2 V, 11.8 cd/A, 3.3 lm/W (0.27, 0.65) | 1,500 hrs | 6,000 hrs |
| Comparative Example 1 | 9 V, 11.0 cd/A, 3.0 lm/W (0.28, 0.65) | 500 hrs | 2,000 hrs |

Referring to Table 1, the organic electroluminescent device fabricated in Example 4 had a longer half-life than the organic electroluminescent device according to Comparative Example 1.

In addition, the organic electroluminescent devices manufactured according to Example 1, Example 2, and Example 3 had initial characteristics and half-life characteristics similar to those of the organic electroluminescent device manufactured according to Comparative Example 1.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising a green emission layer, comprising:
    a green emission material; and
    a blue emission material, where the blue emission material is Compound B

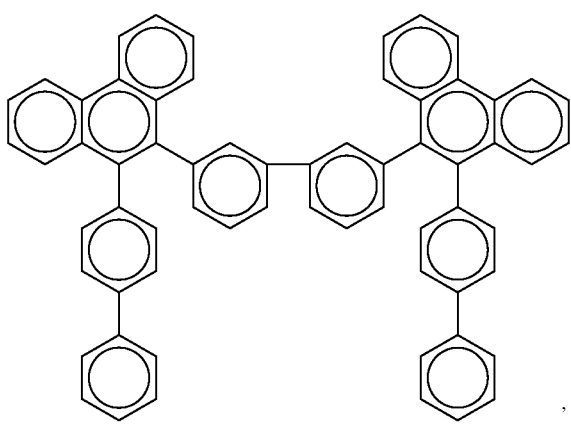

Compound B wherein the green emission layer is interposed between a pair of electrodes.

2. The organic electroluminescent device of claim 1, wherein a concentration of the blue emission material is in a range of 80 to 120 parts by weight based on 100 parts by weight of the green emission material.

3. The organic electroluminescent device of claim 1, wherein the green emission material comprises:

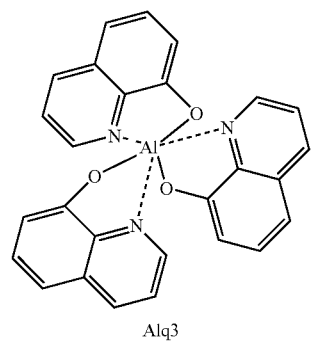

Alq3

4. The organic electroluminescent device of claim 1, wherein the emission layer is about 300 Å to 500 Å thick.

5. The organic electroluminescent device of claim 1, wherein the green emission layer further comprises:
    a dopant, where the dopant is

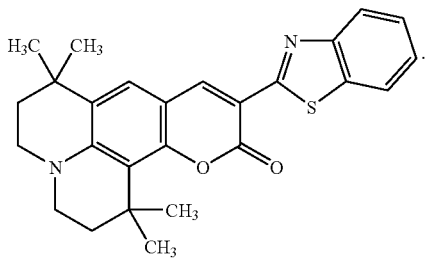

C545T

6. The organic electroluminescent device of claim 5, wherein a concentration of the dopant is in the range of 0.2 to 3 parts by weight based on 100 parts of the total weight of the green emission material and the blue emission material.

7. The organic electroluminescent device of claim 1, further comprising at least a layer selected from the group consisting of:
    a hole injection layer;
    hole transport layer;
    an electron injection layer;
    an electron transport layer; and
    a hole blocking layer.

8. An organic electroluminescent device, comprising:
    a first electrode;
    a hole transport layer formed on the first electrode;
    a green emission layer comprising a green emission material and a blue emission material and formed on the hole transport layer, where the blue emission material is Compound B

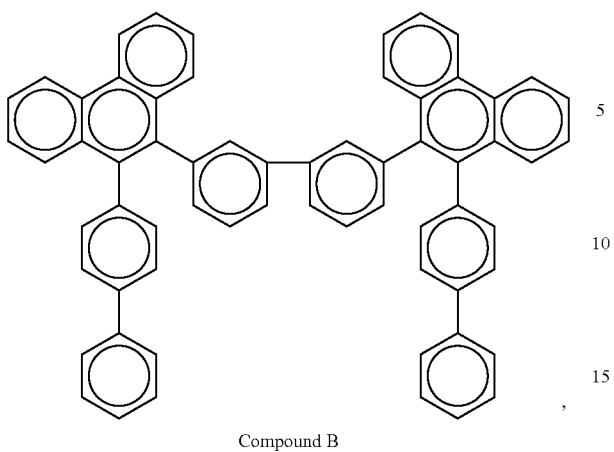

Compound B

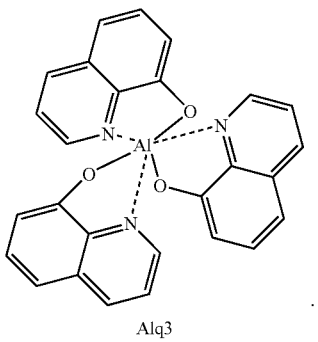

Alq3 an electron transport layer formed on the green emission layer; and a second electrode formed on the electron transport layer.

9. The organic electroluminescent device of claim 8, wherein a concentration of the blue emission material is in a range of 80 to 120 parts by weight based on 100 parts by weight of the green emission material.

10. The organic electroluminescent device of claim 8, wherein the green emission material comprises $Alq_3$:

11. The organic electroluminescent device of claim 8, wherein the green emission layer further comprises:

a dopant, where the dopant is C545T:

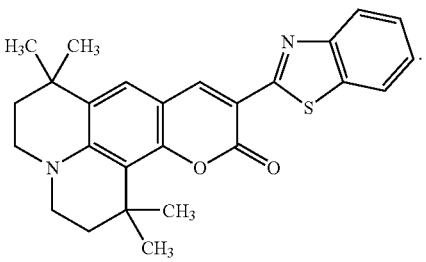

C545T

12. The organic electroluminescent device of claim 11, wherein a concentration of the dopant is in a range of 0.2 to 3 parts by weight based on 100 parts of the total weight of the green emission material and the blue emission material.

13. The organic electroluminescent device of claim 8, further comprising:

a hole injection layer formed between the first electrode and the hole transport layer.

14. The organic electroluminescent device of claim 8, further comprising:

an electron injection layer formed between the electron transport layer and the second electrode.

* * * * *